(12) United States Patent
Gutsmann et al.

(10) Patent No.: US 7,023,086 B2
(45) Date of Patent: Apr. 4, 2006

(54) SEMICONDUCTOR COMPONENT ARRANGEMENT WITH A REDUCED OSCILLATION TENDENCY

(75) Inventors: Bernd Gutsmann, Warstein (DE); Paul-Christian Mourick, Fuerth (DE); Gerhard Miller, Penzing (DE); Dieter Silber, Obertshausen (DE)

(73) Assignee: Infineon Technologies AG, Munich (DE)

( * ) Notice: Subject to any disclaimer, the term of this patent is extended or adjusted under 35 U.S.C. 154(b) by 17 days.

(21) Appl. No.: 10/497,380

(22) PCT Filed: Nov. 20, 2002

(86) PCT No.: PCT/EP02/12966

§ 371 (c)(1),
(2), (4) Date: Nov. 1, 2004

(87) PCT Pub. No.: WO03/049185

PCT Pub. Date: Jun. 12, 2003

(65) Prior Publication Data

US 2005/0054147 A1    Mar. 10, 2005

(30) Foreign Application Priority Data

Dec. 6, 2001 (DE) ................................ 101 59 851

(51) Int. Cl.
*H01L 23/34* (2006.01)
(52) U.S. Cl. ................ 257/728; 257/773; 257/659; 257/684; 257/690; 257/704; 257/710; 257/723; 257/731
(58) Field of Classification Search ................ 257/773, 257/728, 659, 684, 690, 704, 710, 723, 731
See application file for complete search history.

(56) References Cited

FOREIGN PATENT DOCUMENTS

| DE | 195 49 011 | 7/1997 |
|----|-----------|--------|
| DE | 199 38 302 | 3/2000 |
| EP | 0 277 546 B1 | 6/1992 |
| EP | 0 427 143 B1 | 2/1995 |
| JP | 2001185679 A | 7/2001 |

OTHER PUBLICATIONS

Gutsmann, B. et al., "Exact Inductive Parasitic Extraction for Analysis of IGBT Parallel Switching including DCB-Backside Eddy Currents," IEEE, pp. 1291-1295 (2000).
Gutsmann, Bernd et al., "Explanation of IGBT Tail Current Oscillations by a Novel "Plasma Extraction Transit Time" Mechanism," Proceedings of the 31st European Solid-State Device Research Conference, pp. 4 (Sep. 11-13, 2001).
Takahashi, Yoshikazu et al., "Ultra High-Power 2.5kV-1800A Power Pack IGBT," IEEE International Symposium on Power Semiconductor Devices and ICs, pp. 233-236 (May 26-29, 1997).

*Primary Examiner*—David Nelms
*Assistant Examiner*—Tram H. Nguyen
(74) *Attorney, Agent, or Firm*—Dicke, Billig & Czaja, PLLC

(57) ABSTRACT

The present invention relates to a circuit assembly with at least two semiconductor components, each having terminals, whereby at least one terminal of the first semiconductor component is connected to a terminal of the other semiconductor component in an electrically conductive manner. The circuit assembly damps high-frequency oscillations that occur during switching operations. An eddy-current damping structure is provided above said assembly at a distance from the semiconductor components or said semiconductor components are directly connected to each other by means of a high-resistance wire connection in addition to the existent electroconductive connection.

17 Claims, 7 Drawing Sheets

SEMICONDUCTOR COMPONENT ARRANGEMENT WITH A REDUCED OSCILLATION TENDENCY

CROSS REFERENCE TO RELATED APPLICATION(S)

This Utility Patent Application claims the benefit of the filing date of Application No. DE 101 59 851.3, filed Dec. 6, 2001, and International Application No. PCT/EP02/12966, filed Nov. 20, 2002, both of which are herein incorporated by reference.

BACKGROUND

Some circuit arrangements are compact modules for power-electronic installations, in which different power components are connected up to form standardized subunits. In this case, parallel circuits of two or more transistors or diodes are produced in order to increase the maximum current-carrying capacity of the circuit.

FIG. 1 illustrates an example of a power module for switching large currents according to the prior art, and the electrical equivalent circuit diagram is shown in FIG. 2. Such an arrangement is disclosed for example in EP 0 427 143 B1 or EP 0 277 546 A1. In the case of the circuit illustrated, two semiconductor switching elements, in particular power IGBT, are present, which are in each case integrated in a semiconductor body 120, 122 and arranged on a carrying plate 160. The carrying plate 160 is usually constructed in two layers with a carrier 160b and a rear side metallization 160a.

A top side, or at least part of the surface of the semiconductor bodies 120, 122 forms terminals 121, 123—in the present case the emitter or source terminals E—of the components. The gate terminals G are not illustrated separately in FIG. 1; they may be situated in a region of the surfaces which is insulated from the emitter or source terminals. The collector or drain terminals of the transistors integrated in the semiconductor bodies 120, 122 are usually formed by rear sides of the semiconductor bodies, which, in the case illustrated, are conductively connected to one another by a busbar 110 to which the semiconductor bodies are applied.

The terminals 121, 123 are connected by means of bonding wires 140, 142, of which a plurality are provided per device in order to increase the current-carrying capacity, to a common line, in the present case a busbar 130, which can be connected to a circuit potential.

The carrying plate 160 with the busbars 110, 130 may be designed as DCB substrate (DCB=direct copper bonding). The busbars 110, 130 are copper regions or copper islands on a ceramic substrate as carrier 40a. The rear side metallization is likewise composed of copper.

When the parallel-connected emitter-collector paths or drain-source paths (in series with a load) are connected to a supply voltage, high-frequency oscillations which lead to electromagnetic interference emissions arise both when the transistors are switched on, that is to say driven into the on state, and when the transistors are switched off, that is to say driven into the off state. Such oscillations are reported, for example, in Y. Takahashi, K. Yoshikawa, T. Koga, M. Soutome, T. Takano, H. Kirihata, Y. Seki: "Ultra high power 2.5 kV–1800 A Power Pack IGBT, Proceedings of ISPSD, 1997, 233–236 or B. Gutsmann, P. Mourick, D. Silber: "Explanation of IGBT Tail Current Oscillations by a Novel 'Plasma Extraction Transit Time' Mechanism", 31$^{st}$ European Solid-State Device Research Conference ESSDERC, Sep. 11–13, 2001, 255–258.

SUMMARY

One embodiment of the present invention provides a circuit arrangement having at least two semiconductor components each having terminals. At least one terminal of one semiconductor component is electrically conductively connected to a terminal of the other semiconductor component such that the occurrence of high-frequency oscillations during the switching-on or switching-off operation is prevented, or said oscillations are at least greatly attenuated, in the semiconductor components.

In the case of the circuit arrangement according to one embodiment of the invention, an eddy current attenuation structure is provided above the arrangement in a manner spaced apart from the semiconductor components, which structure is of plate-type, lattice-type, frame-type or loop-type design.

The high-frequency oscillations occurring during the switching operations should result from resonant circuits which are formed by junction capacitances C10, C20 of the transistor T10, T20 and line inductances LP, as is illustrated in FIG. 2 on the basis of a parallel circuit of two transistors.

The high-frequency oscillations arising during the switching operations in the semiconductor components and the leads thereof induce eddy currents in the attenuation structure according to one embodiment of the invention. The attenuation structure has a suitable resistance, which results in ohmic losses which react upon the resonant circuit and attenuate the high-frequency oscillations.

In this case, a sheet resistance of the attenuation structure, which is in one embodiment formed flat, is large enough to bring about ohmic losses in the case of the induced eddy currents, but small enough to actually enable eddy currents to arise. If the attenuation structure has an excessively large resistance, no eddy currents arise and the attenuation structure is ineffectual. The attenuation structure is likewise ineffectual in the case where it has an excessively small resistance, so that ohmic losses scarcely arise. The resistance value of the attenuation structure for which an optimum attenuation is brought about can be determined by measurements or simulations depending on the precise construction of the circuit arrangement and the number of semiconductor components used.

The eddy current attenuation structure is, in particular, arranged above bonding wires via which the semiconductor components are electrically conductively connected to one another—in particular via a current-conducting rail. These bonding wires provide for particularly good coupling of the high-frequency oscillations into the attenuation structure, which bring about eddy currents there.

Preventing, or at least attenuating, high-frequency oscillations during the switching operations is furthermore achieved by means of a circuit arrangement according to an embodiment of the invention where provision is made for providing, in addition to an existing electrically conductive connection between the semiconductor components, a high-impedance line connection. In one embodiment a bonding wire, which directly connects the two semiconductor components to one another, is provided.

This direct connection influences the inductance and the resistance of the parasitic resonant circuit. In this case, the resistance can be set depending on the frequency of the oscillations that occur such that particularly high losses occur within a desired frequency range and lead to an attenuation of the high-frequency oscillation.

The attenuation structure above the circuit arrangement and the high-impedance direct connection ("direct bonding") are used jointly.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 3:
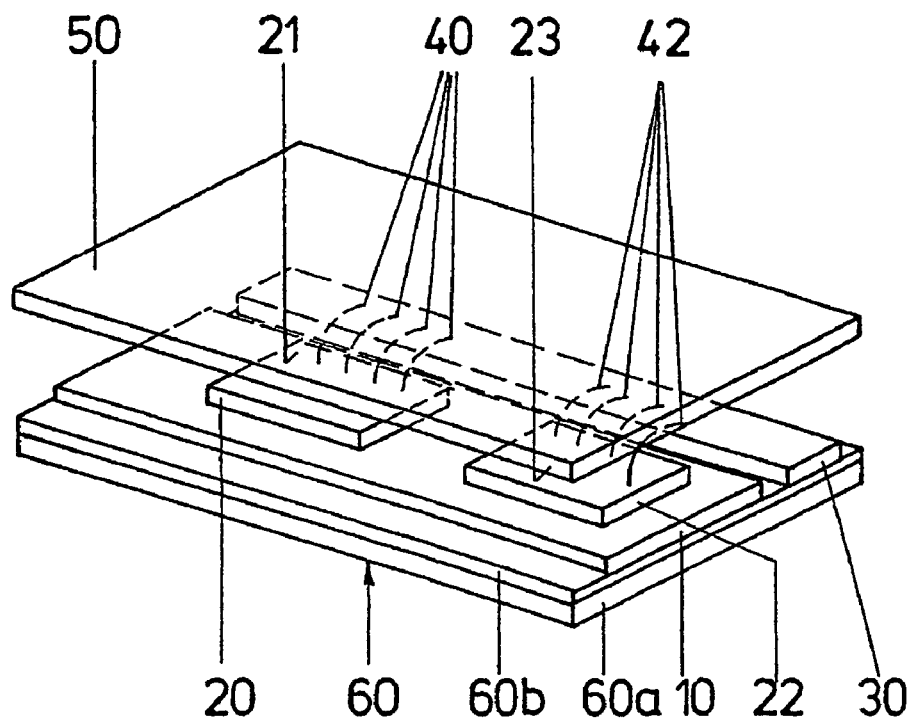
FIG. 3 illustrates an exemplary embodiment of a circuit arrangement according to the invention with a plate-type attenuation structure.

FIG. 3 illustrates a perspective view of an exemplary embodiment of a circuit arrangement according to one embodiment of the invention. In the example illustrated, two semiconductor components are provided, which are in each case integrated in a semiconductor body 20, 22. Said semiconductor components are power diodes or power transistors, for example. The semiconductor bodies 20, 22 are applied to a carrier arrangement 60 with a carrier plate 60a, 60b.

In the case of the components, one terminal of the semiconductor components, for example, the emitter or source terminal in the case of transistors, is formed by the top side 21, 23 of the semiconductor components 20, 22. These terminals 21, 23 of the semiconductor components are electrically conductively connected to one another. For example, said terminals 21, 23 are in each case connected by means of line connections 40, 42, for example bonding wires, to a current-conducting rail 30 which is applied on the carrier plate 60a, 60b and is part of the carrier arrangement. In order to increase the current-carrying capacity or in order to reduce the nonreactive resistance between the terminals 21 and 23 and the busbar 30, a plurality of bonding wires 40, 42 in each case are provided per terminal 21, 23.

The semiconductor bodies 21, 22 are applied to a further busbar 10 of the carrier arrangement 60, said busbar being insulated from the busbar 30. Said busbar 10 electrically conductively connects together the rear sides, which, in the case of power transistors, usually form the collector or drain terminals thereof. The carrying plate is designed in particular as a DCB substrate (DCB=direct copper bonding) having copper islands spaced apart from one another on an insulating carrier 60b, usually a ceramic. In this case, the busbars 10, 30 are respectively formed by one of the copper islands.

The bonding wires 40, 42 and the busbars 10, 30 form a conductor loop which connects the components 20, 22 and to which the plate-type attenuation structure 50 is arranged essentially parallel.

If the components are driven such that they change from an on to an off state or from an off to an on state then high-frequency oscillations may occur on account of parasitic effects.

In order to prevent or at least attenuate these high-frequency oscillations, according to one embodiment of the invention, a plate-type attenuation structure 50 is provided above the arrangement with the semiconductor components 20, 22 and the bonding wires 40, 42, which attenuation structure is not electrically conductively connected to the semiconductor components 20, 22 and the bonding wires 40, 42. Said plate-type attenuation structure 50 is electrically conductive and has a sheet resistance that depends on the further properties of the circuit arrangement, as will be explained in more detail below.

The high-frequency oscillations arising during the switching operations produce eddy currents in the plate-type attenuation structure 50, the resistance of this structure being chosen in such a way that, on account of these induced eddy currents, ohmic losses maximally arise in the structure 50 in order to attenuate the high-frequency oscillations in this way.

Figure 4:
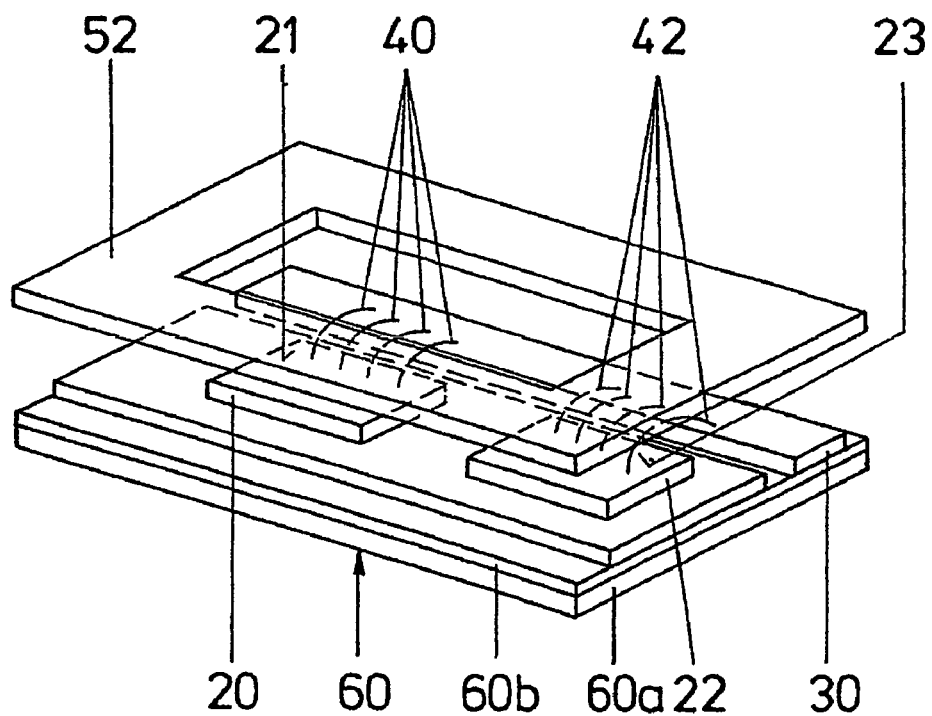
FIG. 4 illustrates an exemplary embodiment of a circuit arrangement according to the invention with a frame-type attenuation structure.

FIG. 4 illustrates a further exemplary embodiment of a circuit arrangement according to one embodiment the invention, which differs from that shown in FIG. 3 by the fact that an attenuation structure 52 is provided above the semiconductor components 20, 22, which attenuation structure is essentially designed as a flat frame. In this attenuation structure 52, too, eddy currents are induced by high-frequency oscillations arising during the switching operations. Said high-frequency oscillations are emitted in particular by the bonding wires 40, 42, which act as antennas in this regard.

Figure 5:
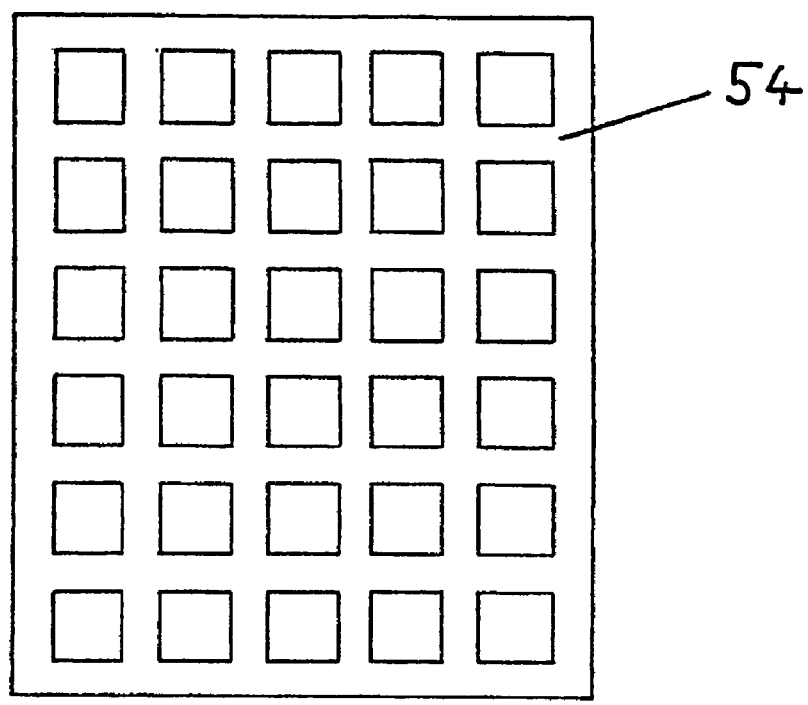
FIG. 5 illustrates a lattice-type attenuation structure in plan view.

FIG. 5 illustrates a plan view of a further embodiment of a possible attenuation structure which can be used according to one embodiment of the attenuation structures 50, 52 in accordance with FIGS. 3 and 4. This attenuation structure 54 is designed as a flat lattice-type element.

A customary value for the minimum distance between the bonding wires at their point that projects the furthest from the semiconductor bodies 20, 22 and the attenuation structure 50, 52, 54 is 0.1 mm to 5 mm.

Figure 1:
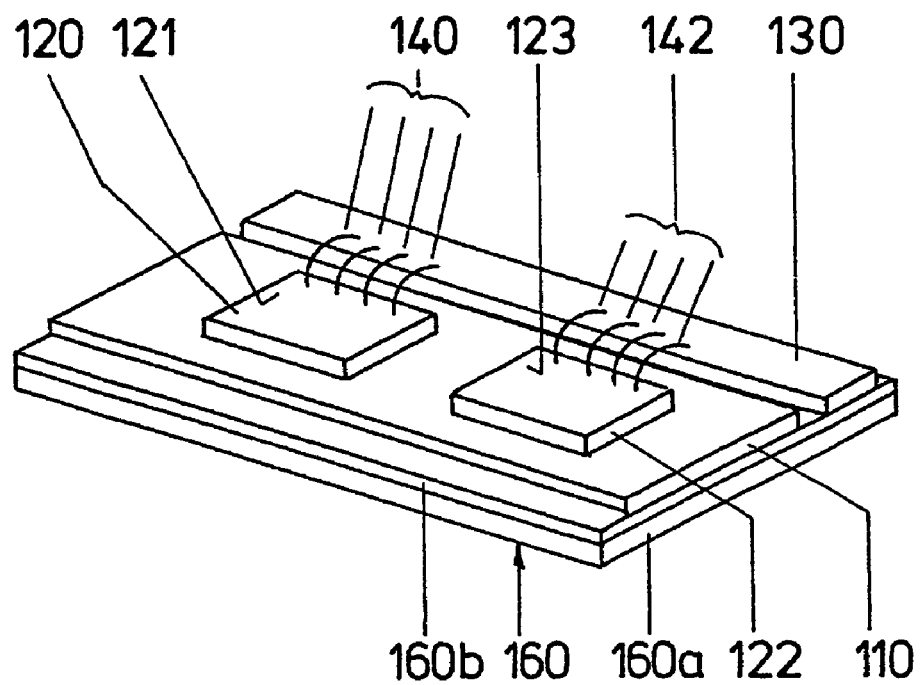
FIG. 1 illustrates a circuit arrangement according to the prior art.
Figure 2:
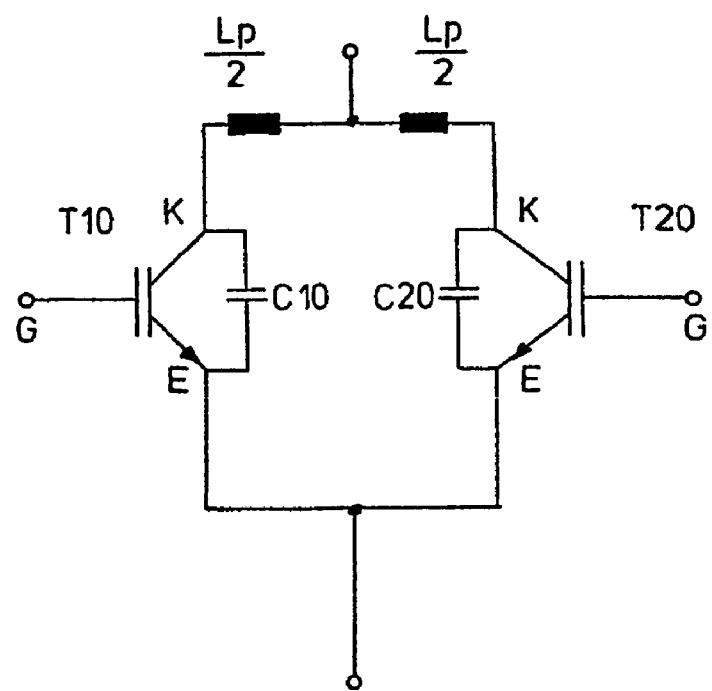
FIG. 2 illustrates an equivalent circuit diagram of the circuit arrangement according to FIG. 1.

The carrier plate—preferably designed as a DCB substrate—in accordance with FIGS. 2 and 3 is formed in two layers with an insulating layer 60b, for example, a ceramic, on which the busbars 10, 30 are arranged, and a rear side metallization 60a, for example, made of copper.

Eddy currents are likewise induced in said rear side metallization, but they do not contribute to a sufficient attenuation of the oscillation owing to the usually small electrical resistance of the rear side metallization.

Figure 10:
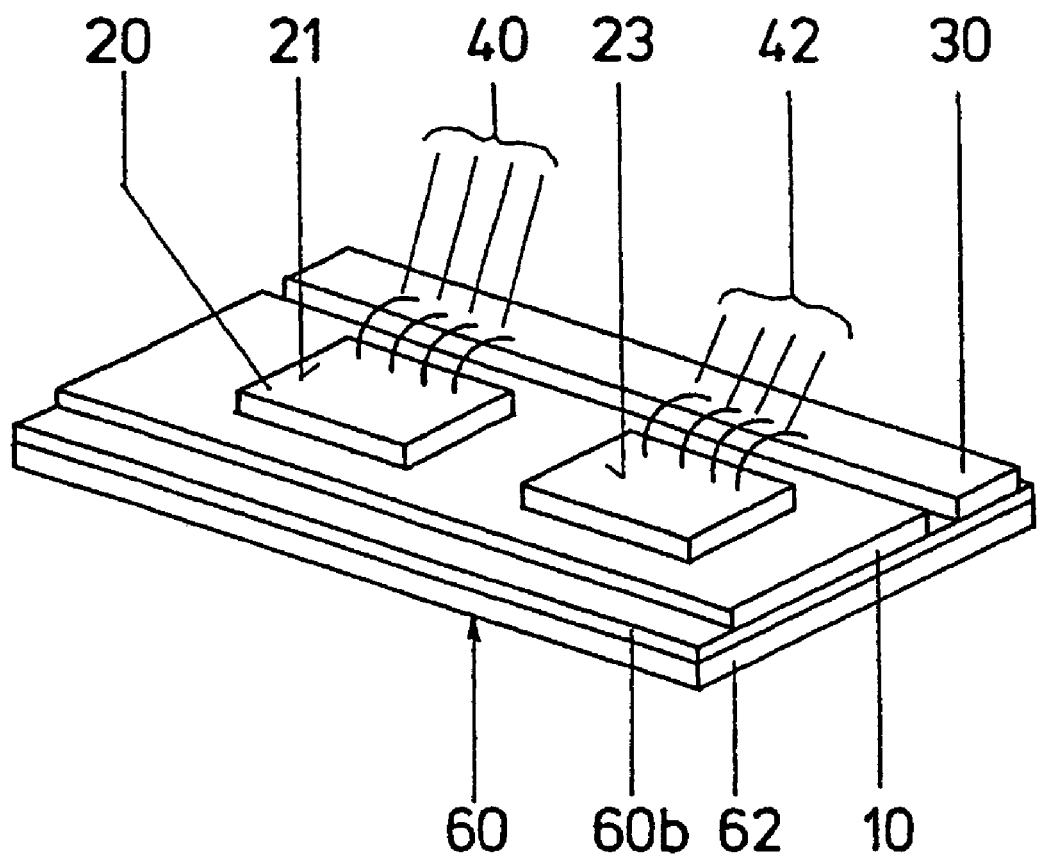
FIG. 10 illustrates a further exemplary embodiment of a circuit arrangement according to the invention with a plate-type attenuation structure.

In the case of a further embodiment illustrated in FIG. 10, provision is made for forming an attenuation structure 62 instead of a low-impedance rear side metallization below the insulating layer 60b. The attenuation structures arranged above the components 20, 22, as are illustrated, for example in FIGS. 3 and 4, can then be dispensed with, if appropriate.

The attenuation structures are preferably composed of a material which has the desired high electrical resistance for attenuating the eddy currents. This material may be formed as homogeneous material or else as inhomogeneous material. The inhomogeneous material preferably has regions (islands) having a low electrical resistance between which high-impedance regions are arranged.

FIG. 6 illustrates the influence of a plate-type attenuation structure on the series resistance and the series inductance of a parasitic resonant circuit depending on the distance between the plate-type attenuation structure and the bonding wires for different sheet resistances of the plate-type attenuation structure.

The dashed lines (at the bottom in FIG. 6a and at the top in FIG. 6b) show the value for the series resistance and the series inductance without any attenuation structure, which amounts to approximately 0.075 Ω and 5.35 nH, respectively, in the case of the simulated model on which the curve profiles are based.

Figure 6A:
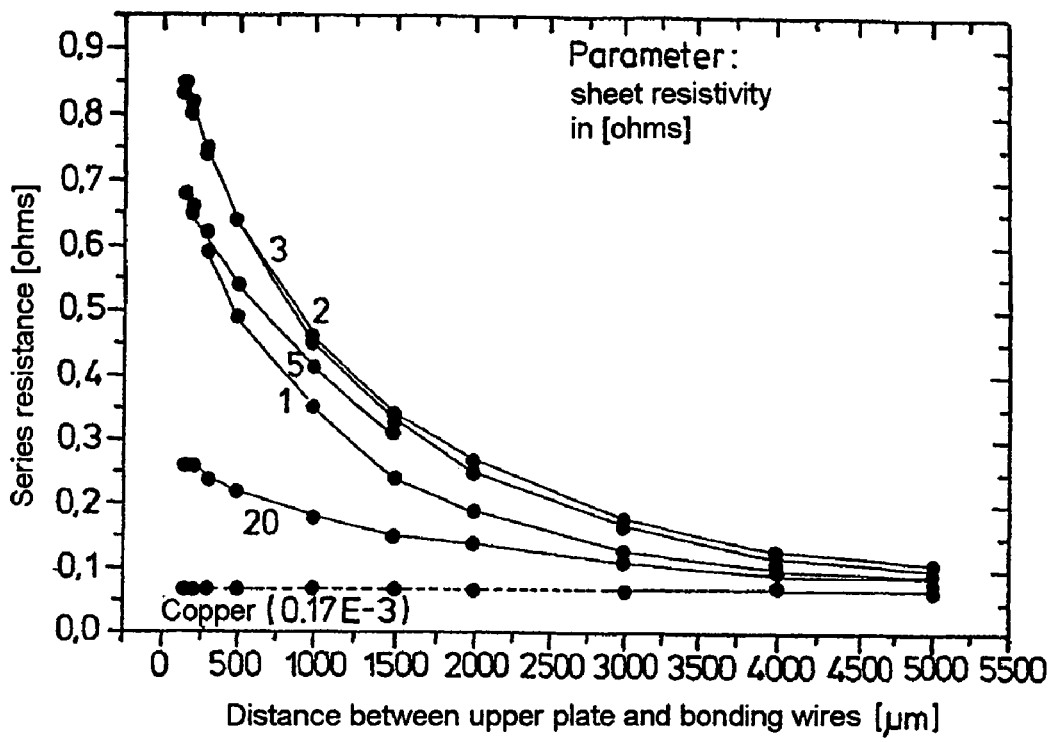
FIG. 6 illustrates series resistance (FIG. 6a) an inductance (FIG. 6b) of a parasitic resonant circuit in the case of a circuit arrangement with an eddy current attenuation structure depending on the distance between the attenuation structure and the semiconductor components for varying sheet resistances.
Figure 6B:
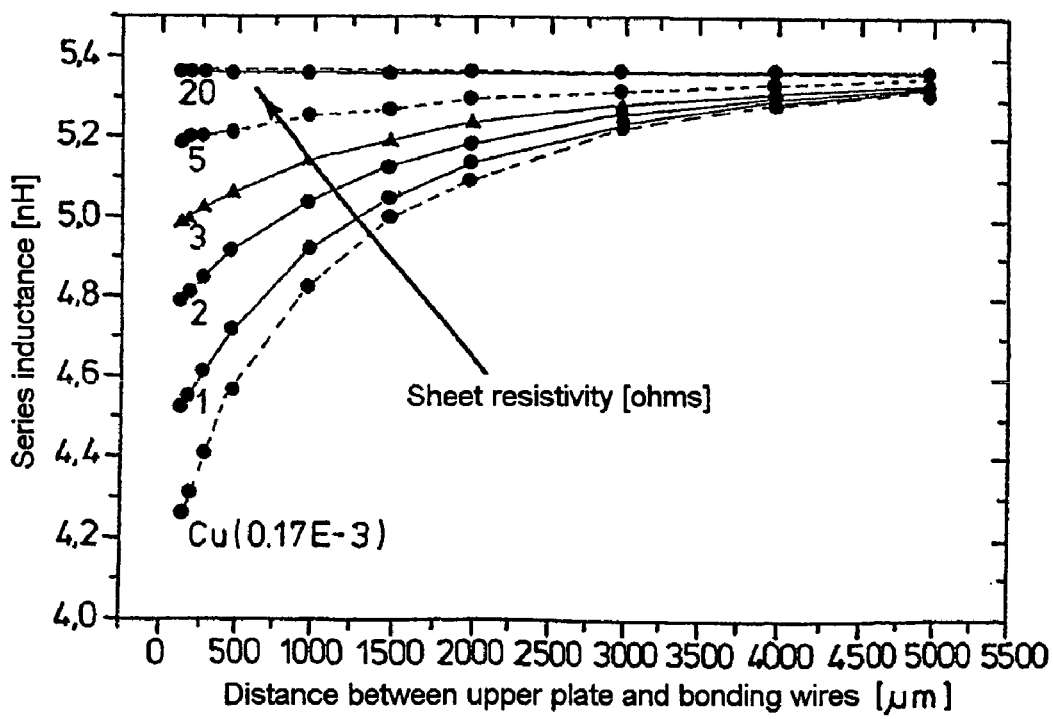

FIGS. 6a and 6b furthermore illustrate the profiles of the series resistance and of the series inductance depending on the distance between the plate-type attenuation structure and the bonding wires for attenuation structures having different sheet resistivities. The different resistivities illustrated amount to $0.17 \cdot 10^{-3}$ ohm/square for copper and furthermore 1 ohm/square, 2 ohm/square, 3 ohm/square, 5 ohm/square and 20 ohm/square. The sheet resistivity results from the resistivity of the respective material divided by the thickness of the plate-type attenuation structure used, which amounts to 100 μm in the present case, so that the sheet resistivity (resistivity per square) for copper results from the quotient of $1.7 \cdot 10^{-8}$ Ω/m (resistivity) and the thickness 100 μm.

It is evident that an attenuation structure made of copper leads the series resistance of the parasitic resonant circuit virtually unchanged and is thus approximately ineffectual with regard to the attenuation.

Generally, it is evident that the attenuation structure is all the more ineffectual, the smaller the distance between the attenuation structure and the bonding wires. This result is not surprising since the field strength decreases with increasing distance from the bonding wires, as a result of which the intensity of the eddy currents induced in the attenuation structure and thus the influence of the attenuation structure on the high-frequency oscillations also decrease.

FIG. 6a also illustrates that the effect of the attenuation structure on the series resistance initially increases as the sheet resistivity of the material used for the attenuation structure increases, and, after reaching a maximum, decreases again for further increasing values. In the case of the exemplary embodiment illustrated in FIG. 6a, materials having a sheet resistivity of 2 to 3 ohms/square bring about the greatest increase in the series resistance of the parasitic resonant circuit and thus the largest effect with regard to the attenuation of the high-frequency oscillations occurring in the resonant circuit. The curve in accordance with FIG. 6a was determined at a resonant circuit frequency of 250 MHz.

The optimum sheet resistivity for the material of the attenuation structure for a given semiconductor circuit arrangement having two or more components, in particular power transistors connected in parallel, can be determined by recording a simulation curve of the type illustrated in FIG. 6a, the material which contributes most to the increase in the series resistance of the parasitic resonant circuit being preferred in one embodiment.

If consideration is given to the profile of the series inductance in FIG. 6b depending on the distance between the upper plate and the bonding wires, then it is noticeable that the attenuation structure reduces the series inductance of the parasitic resonant circuit, this effect decreasing with increasing distance between the attenuation structure and the bonding wires. It holds true with regard to the series inductance that the attenuation structure reduces the series inductance to a greater extent, the lower the sheet resistivity of the material used for the attenuation structure.

Figure 7:
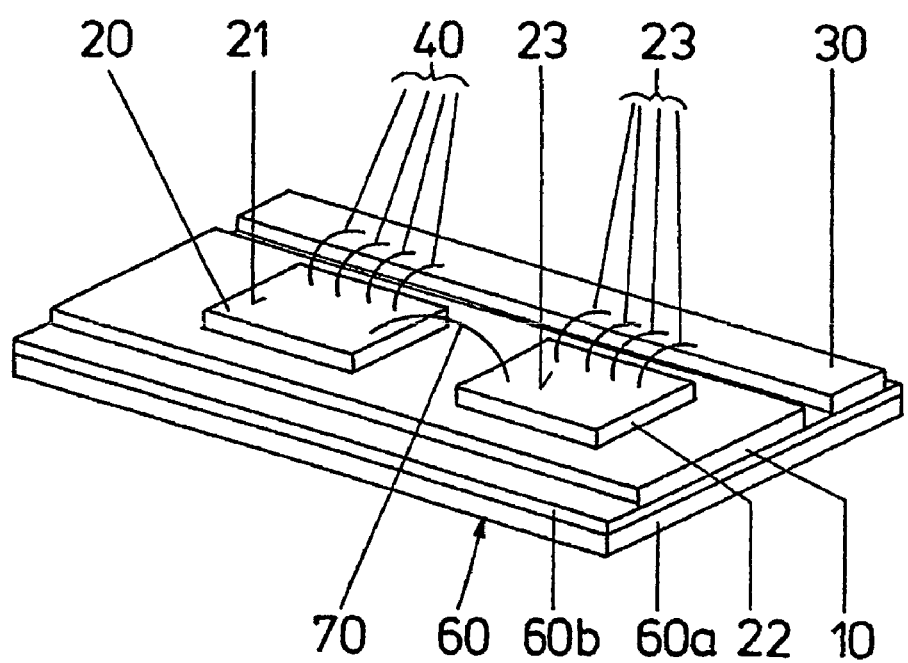
FIG. 7 illustrates an exemplary embodiment of a circuit arrangement according to the invention with a high-impedance direct connection.

FIG. 7 illustrates a further embodiment of a circuit arrangement having two semiconductor components 20, 22, the terminals 21, 23 of which are connected to one another via bonding wires 40, 42 and a busbar 30. This embodiment of the circuit arrangement differs from the circuit arrangements illustrated in FIGS. 3 to 5 and described above by virtue of the fact that, instead of the plate- or frame-type attenuation structure, a high-impedance line connection 70 is provided, which electrically conductively connects the terminals 21, 23 of the semiconductor components 20, 22 to one another in addition to the already present electrically conductive connection via the bonding wires 40, 42 and the busbar 30. In this case, the line connection 70 is formed in particular as a bonding wire.

In one embodiment, the electrical resistance of the material used for this bonding wire 70 amounts to between 100 and 10,000 times the electrical resistance of aluminium.

Figure 8A:
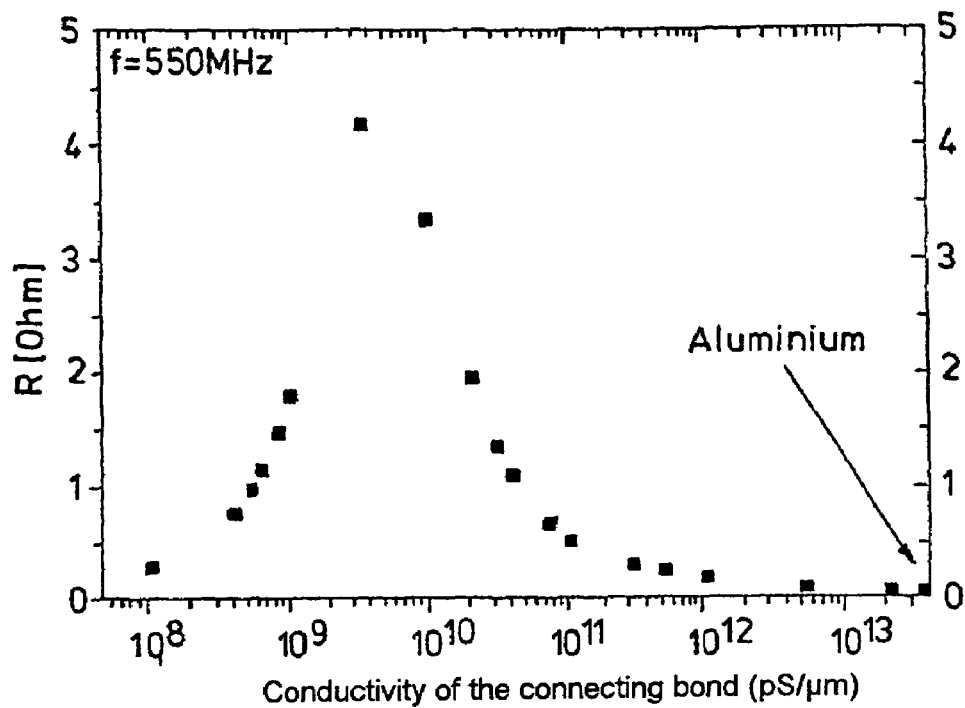
FIG. 8 illustrates series resistance (FIG. 8a) and inductance (FIG. 8b) of a parasitic resonant circuit in the case of a circuit arrangement with direct connection depending on the conductivity of the direct connection at a selected frequency (550 MHz).

By means of this high-impedance bonding wire 70 in comparison with customary bonding wires, the inductance of the parasitic resonant circuit, which is critically formed by the bonding wires 40, 42 and the busbar 30 between the terminals 21 and 23 of the components 20, 22 is influenced in such a way that the series resistance of the parasitic resonant circuit is particularly high for a specific frequency or a specific frequency range, as a result of which the losses of the resonant circuit are particularly high for these frequencies, which leads to a great attenuation of high-frequency oscillations having frequencies in this frequency range, as is explained below with reference to FIG. 8a.

FIG. 8a illustrates the profile of the series resistance of the parasitic resonant circuit for a given frequency of 550 MHz, which represents a customary value for the high-frequency oscillations occurring during the switching operations, for different values of the conductivity of the bonding wire 70 (connecting bond) that directly connect the components 20, 22. In this case, the series resistance rises up to a maximum proceeding from low conductivities for the bonding wire 70 in order then to decrease again for further increasing conductivities of the bonding wire 70. In the example illustrated, a conductivity of the bonding wire 70 of $3.7 \cdot 10^9$ pS/μm is optimal with regard to the attenuation of a high-frequency oscillation with a frequency of 550 MHz, since the series resistance assumes its maximum value for this conductivity value. For comparison, the series resistance when using a bonding wire 17 made of aluminium is illustrated in FIG. 8a and is represented by the value on the far right in FIG. 8a.

Figure 8B:
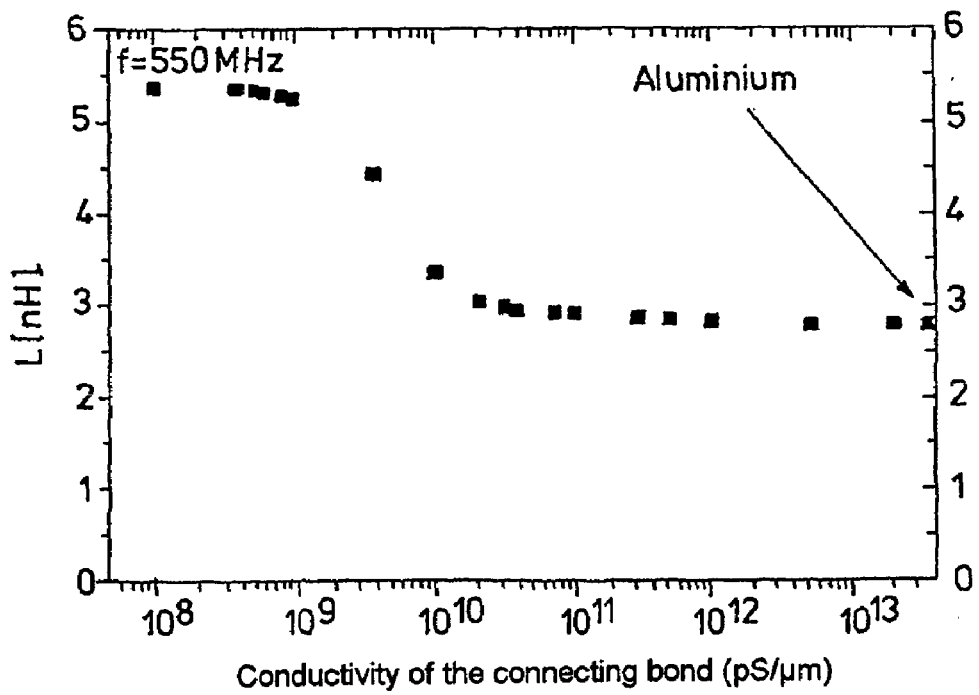

FIG. 8b illustrates the influence of the conductivity of the connecting bond on the series inductance of the parasitic resonant circuit, which makes it clear that the series inductance decreases as the conductivity of the connecting bond increases, and falls particularly steeply in the region in which the series resistance reaches its maximum, in order then to decrease only little as the conductivity of the connecting bond 10 increases. The value for the series inductance when using aluminium as connecting bond is also highlighted for comparison in FIG. 8b.

Figure 9A:
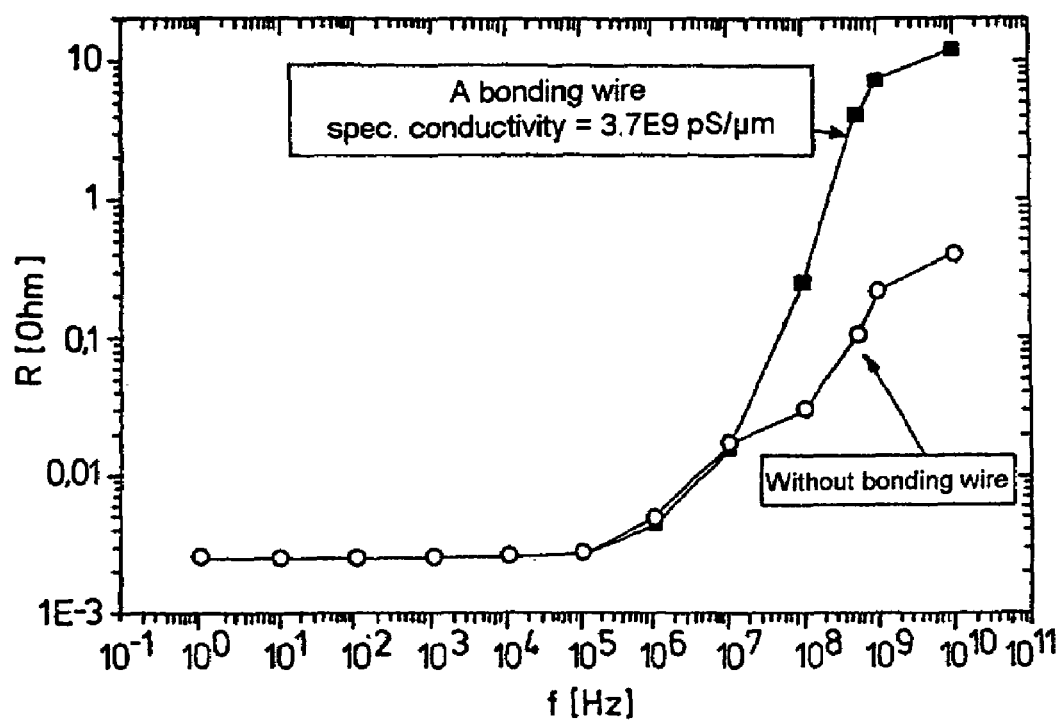
FIG. 9 illustrates series resistance (FIG. 9a) and inductance (FIG. 9b) of a parasitic resonant circuit in the case of a circuit arrangement with direct connection depending on the frequency at a selected specific conductivity ($3.7 \cdot 10^9$ pS/μm).
Figure 9B:
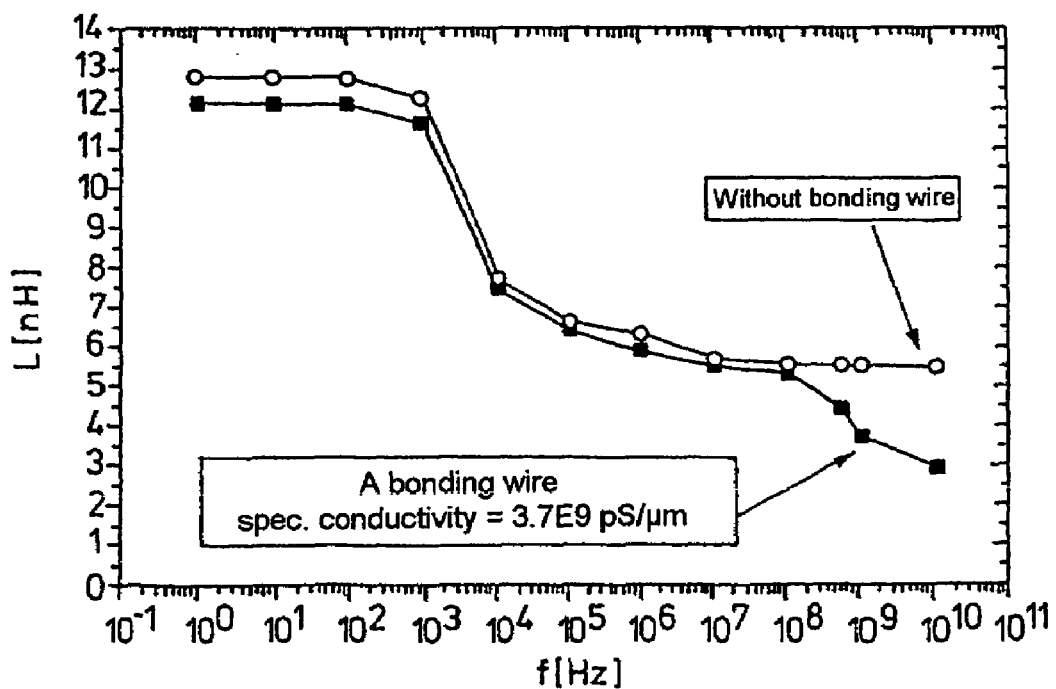

Finally, FIGS. 9a and 9b illustrate the dependence of the series resistance and the series inductance on the frequency for a connecting bond 70 having a conductivity of $3.7 \cdot 10^9$ pS/μm in comparison with an arrangement without a high-impedance connecting bond. It becomes clear that the series resistance increases to a particularly great extent as the frequency of the oscillations increases, given the presence of such a bonding wire, and that, by contrast, the series inductance decreases to a particularly great extent as the frequency of the oscillations increases.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement having at least two semiconductor components each having terminals, said semiconductor components being applied to a carrier arrangement, at least one terminal of one semiconductor component being electrically conductively connected to a terminal of the other semiconductor component, the circuit arrangement comprising:
   an eddy current attenuation structure provided above or below the carrier arrangement;
   wherein the structure is spaced apart from the semiconductor components; and
   wherein the structure is designed to attenuated high-frequency electromagnetic oscillations that emerge from the semiconductor components or leads.

2. The circuit arrangement of claim 1, wherein the attenuation structure is of plate-type design.

3. The circuit arrangement of claim 1, wherein the attenuation structure is of lattice-type design.

4. The circuit arrangement of claim 1, wherein the attenuation structure is of frame-type or loop-type design.

5. The circuit arrangement of claim 1, wherein provision is made of a conductor loop for the electrical connection of the semiconductor components, and wherein the attenuation structure is arranged essentially parallel to the conductor loop.

6. The circuit arrangement of claim 1, wherein the semiconductor components are selected from a group comprising power transistors, thyristors and diodes.

7. The circuit arrangement of claim 1, wherein the terminals of the semiconductor components are connected to a common rail-type connecting line by means of bonding wires.

8. The circuit arrangement of claim 1, wherein the semiconductor components are applied to a carrying plate having a plate-type attenuation structure.

9. The circuit arrangement of claim 8, wherein the terminals of the two semiconductors are additionally connected to one another by means of a high-impedance bonding wire.

10. A circuit arrangement comprising:
    a first semiconductor component having a plurality of terminals;
    a second semiconductor component having a plurality of terminals, wherein at least one terminal of the first semiconductor is electrically conductively connected to at least one terminal of the second semiconductor;
    a carrier arrangement to which both the first and second semiconductors are applied;
    an eddy current attenuation structure provided adjacent the carrier arrangement and spread apart from the first and second semiconductor component; and
    wherein the eddy current attenuation structure is designed to attenuate high-frequency electromagnetic oscillations that emerge from the semiconductor components.

11. The circuit arrangement of claim 10, wherein the eddy current attenuation structure is provided above the carrier arrangement.

12. The circuit arrangement of claim 10, wherein the eddy current attenuation structure is provided below the carrier arrangement.

13. The circuit arrangement of claim 10, wherein the attenuation structure is of plate-type design.

14. The circuit arrangement of claim 10, wherein the attenuation structure is of lattice-type design.

15. The circuit arrangement of claim 10, wherein the attenuation structure is of frame-type or loop-type design.

16. The circuit arrangement of claim 10, wherein provision is made of a conductor loop for the electrical connection of the semiconductor components, and wherein the attenuation structure is arranged essentially parallel to the conductor loop.

17. The circuit arrangement of claim 10, wherein the semiconductor components are selected from a group comprising power transistors, thyristors and diodes.

* * * * *

UNITED STATES PATENT AND TRADEMARK OFFICE
CERTIFICATE OF CORRECTION

PATENT NO. : 7,023,086 B2
APPLICATION NO. : 10/497380
DATED : April 4, 2006
INVENTOR(S) : Bernd Gutsmann et al.

It is certified that error appears in the above-identified patent and that said Letters Patent is hereby corrected as shown below:

Title Page, Inventors (75), delete "Warstein" and insert in place thereof --Weyhe--.

Signed and Sealed this

Twenty-sixth Day of December, 2006

JON W. DUDAS
*Director of the United States Patent and Trademark Office*